US009557361B2

(12) United States Patent
Trend

(10) Patent No.: US 9,557,361 B2
(45) Date of Patent: Jan. 31, 2017

(54) EDGELESS SINGLE-LAYER TOUCH SENSOR

(71) Applicant: Matthew Trend, Fareham (GB)

(72) Inventor: Matthew Trend, Fareham (GB)

(73) Assignee: Atmel Corporation, San Jose, CA (US)

( * ) Notice: Subject to any disclaimer, the term of this patent is extended or adjusted under 35 U.S.C. 154(b) by 111 days.

(21) Appl. No.: 13/904,904

(22) Filed: May 29, 2013

(65) Prior Publication Data
US 2014/0354301 A1  Dec. 4, 2014

(51) Int. Cl.
G01R 27/26 (2006.01)
G06F 3/044 (2006.01)
H03K 17/96 (2006.01)

(52) U.S. Cl.
CPC .......... G01R 27/2605 (2013.01); G06F 3/044 (2013.01); H03K 17/962 (2013.01); H03K 2017/9602 (2013.01); H03K 2217/960775 (2013.01)

(58) Field of Classification Search
CPC ..... G01R 27/26; G01R 27/2605; G06F 3/041; G06F 3/044
See application file for complete search history.

(56) References Cited

U.S. PATENT DOCUMENTS

| | | | |
|---|---|---|---|
| 7,663,607 B2 | 2/2010 | Hotelling | |
| 7,875,814 B2 | 1/2011 | Chen | |
| 7,920,129 B2 | 4/2011 | Hotelling | |
| 8,031,094 B2 | 10/2011 | Hotelling | |
| 8,031,174 B2 | 10/2011 | Hamblin | |
| 8,040,326 B2 | 10/2011 | Hotelling | |
| 8,049,732 B2 | 11/2011 | Hotelling | |
| 8,179,381 B2 | 5/2012 | Frey | |
| 2009/0231298 A1* | 9/2009 | Yang | 345/173 |
| 2009/0315854 A1 | 12/2009 | Matsuo | |
| 2012/0062250 A1* | 3/2012 | Kuo | 324/686 |
| 2012/0227259 A1* | 9/2012 | Badaye | G06F 3/044 29/846 |
| 2012/0242588 A1 | 9/2012 | Myers | |
| 2012/0242592 A1 | 9/2012 | Rothkopf | |

(Continued)

FOREIGN PATENT DOCUMENTS

WO  WO 2012/129247  9/2012

OTHER PUBLICATIONS

U.S. Appl. No. 61/454,936, filed Mar. 21, 2011, Myers.
U.S. Appl. No. 61/454,950, filed Mar. 21, 2011, Lynch.
U.S. Appl. No. 61/454,894, filed Mar. 21, 2011, Rothkopf.

Primary Examiner — Amr Awad
Assistant Examiner — Wing Chow
(74) Attorney, Agent, or Firm — Baker Botts, LLP

(57) ABSTRACT

A touch sensor includes a substrate and a plurality of columns of electrodes disposed on a first side of the substrate. The substrate includes a first end and a second end opposite the first end. The columns each include a sense electrode and drive electrodes. The columns include a first column adjacent to the first end, a second column adjacent to the second end, and one or more interior columns. The touch sensor also includes a plurality of channels for routing tracks coupled to the drive and sense electrodes. Tracks for the first column are routed in a first channel on a side of the first column opposite from the first end of the substrate. Tracks for the second column are routed in a second channel on a side of the second column opposite from the second end of the substrate. Tracks for the interior columns are dispersed amongst the channels.

21 Claims, 11 Drawing Sheets

(56) References Cited

U.S. PATENT DOCUMENTS

2012/0243151 A1 9/2012 Lynch
2012/0243719 A1 9/2012 Franklin
2012/0256642 A1* 10/2012 Badaye et al. ................ 324/658
2013/0076612 A1 3/2013 Myers
2014/0210765 A1* 7/2014 Peng ............................. 345/174

* cited by examiner

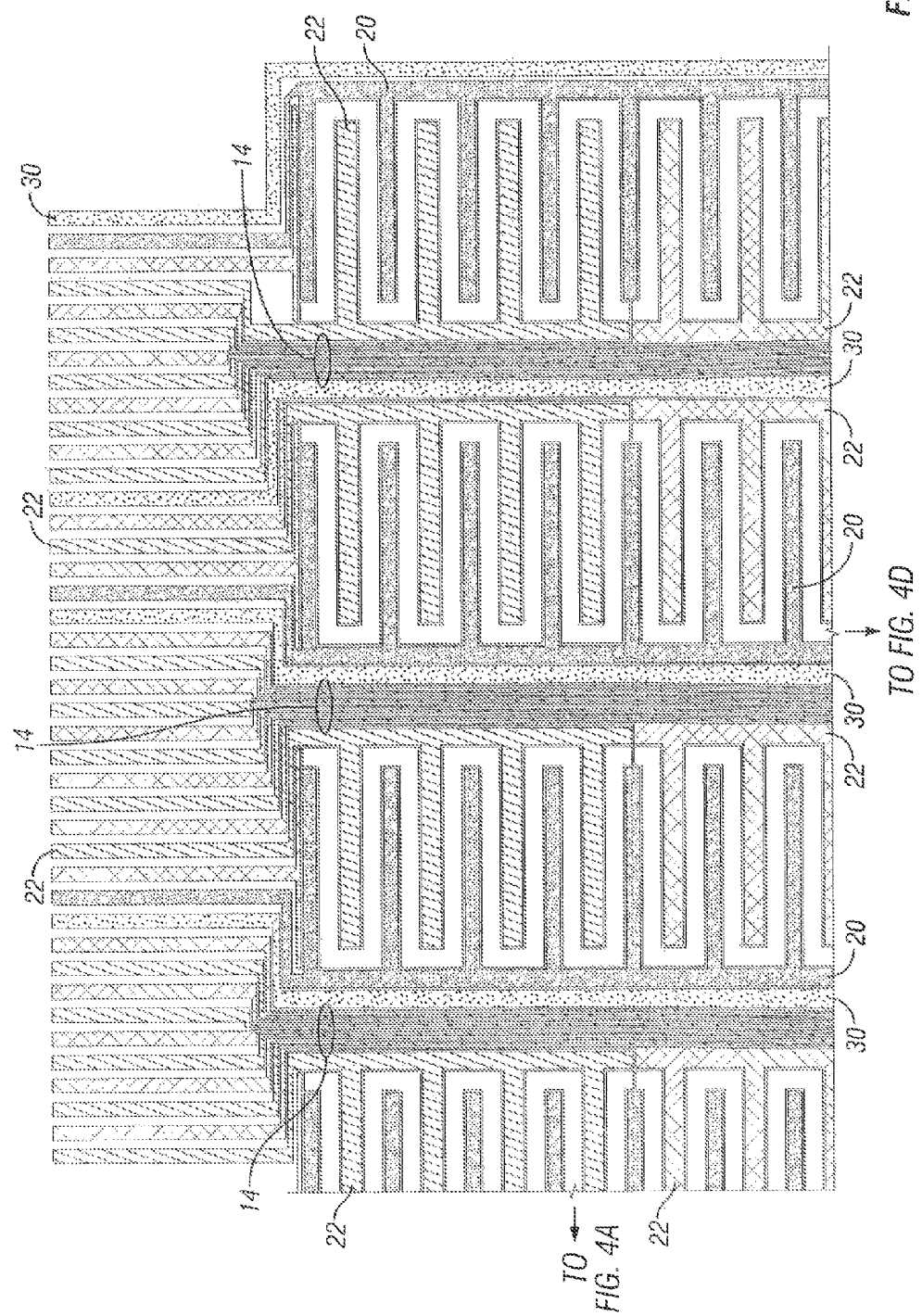

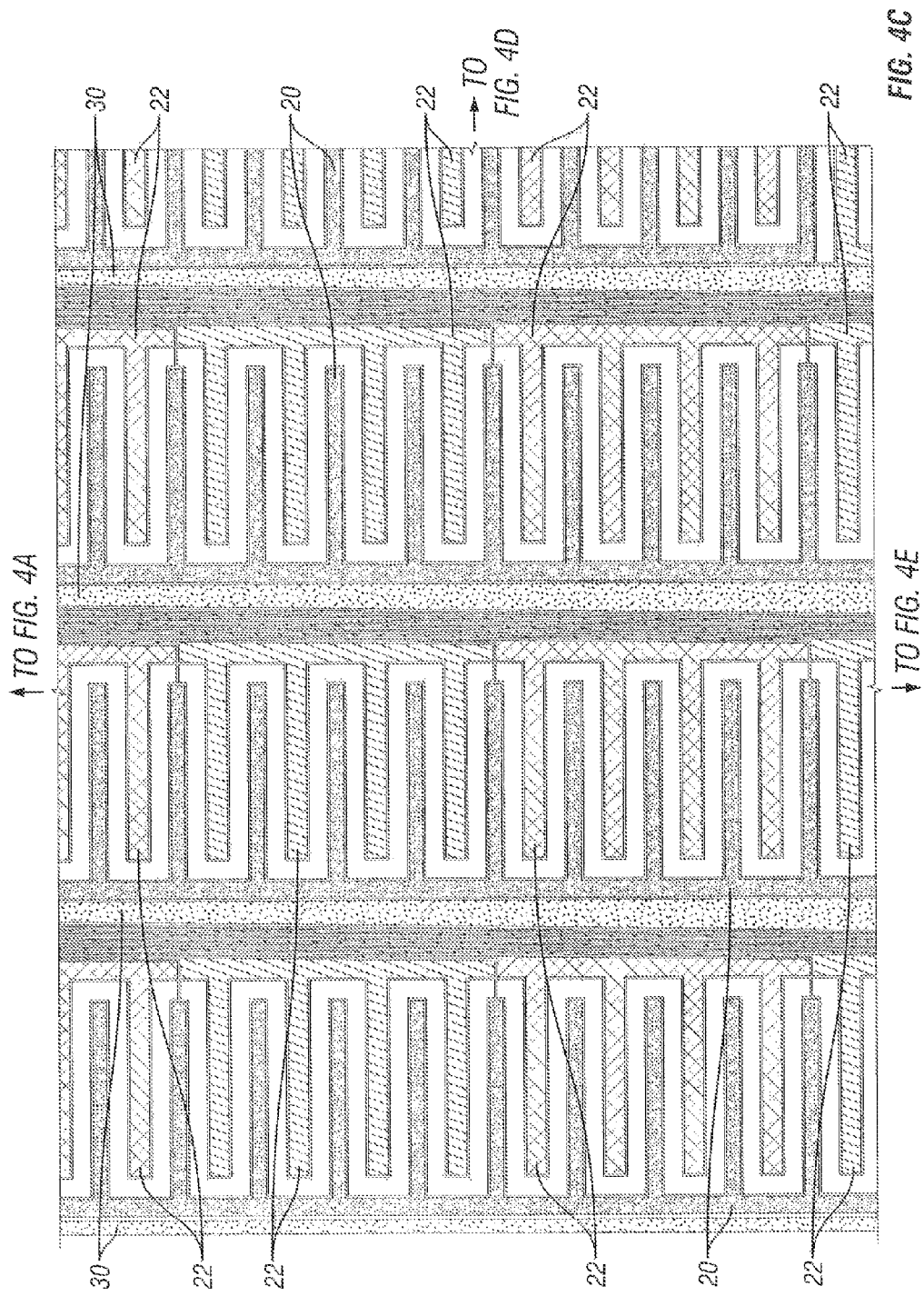

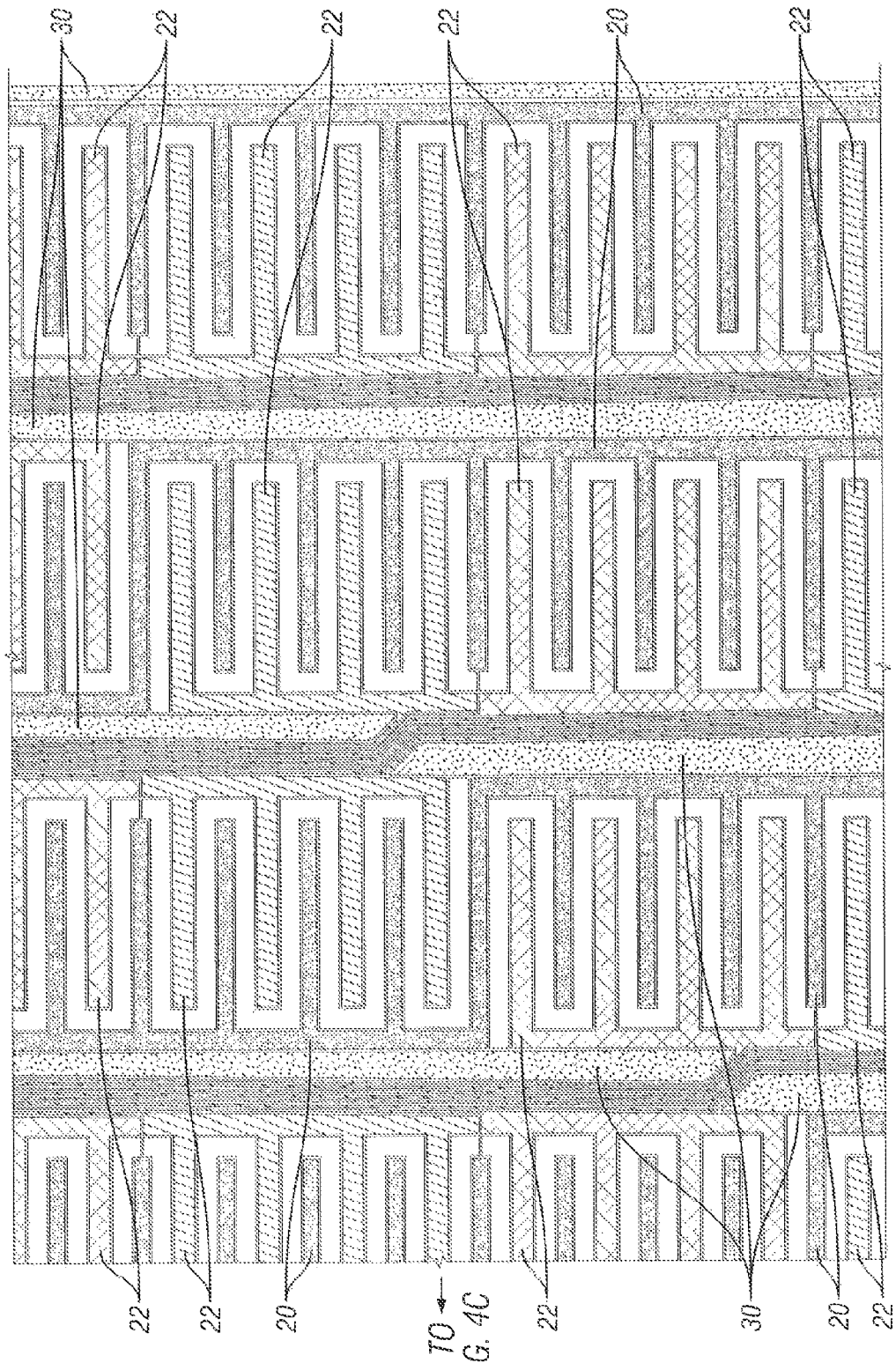

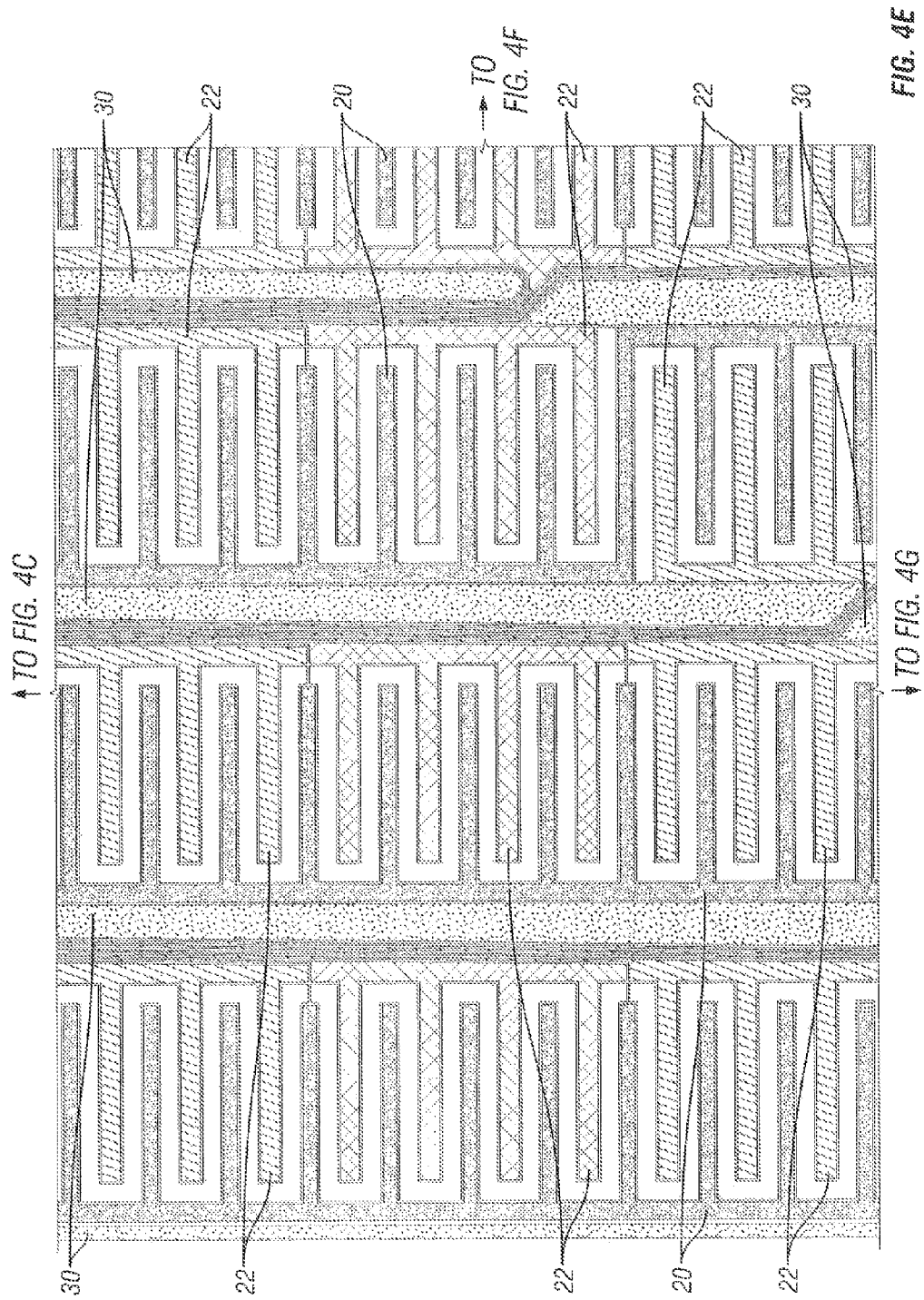

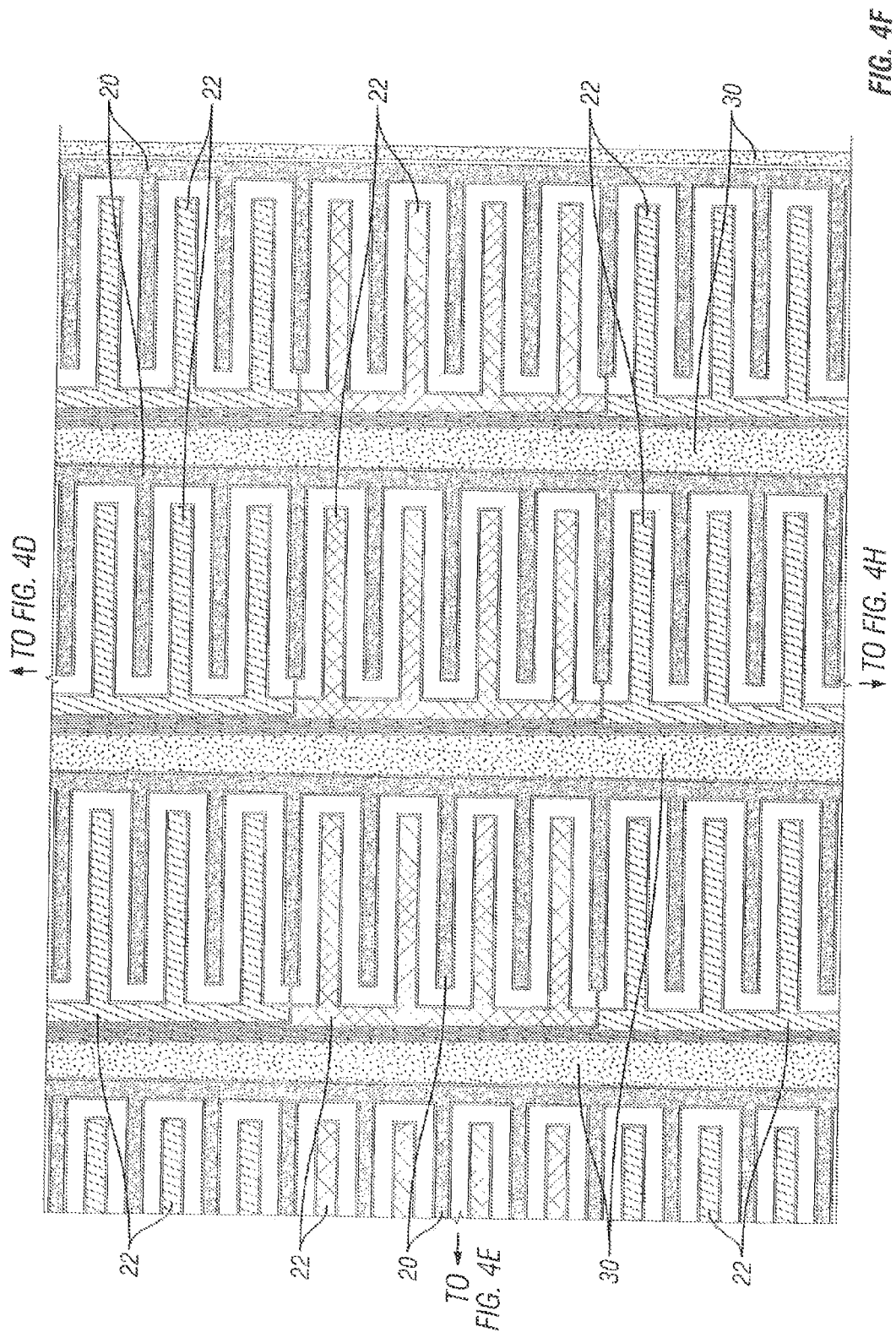

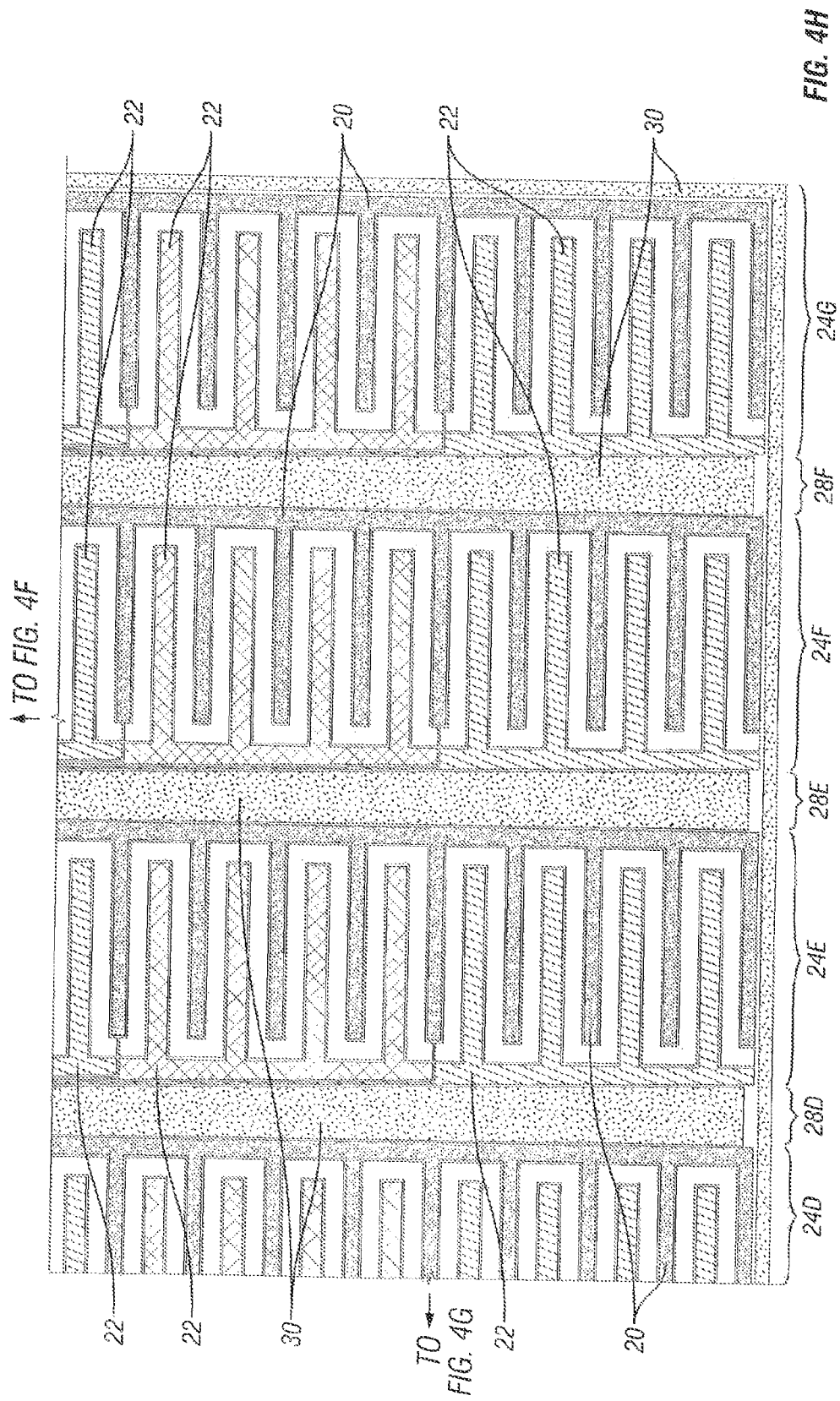

EDGELESS SINGLE-LAYER TOUCH SENSOR

TECHNICAL FIELD

This disclosure generally relates to touch sensors.

BACKGROUND

An array of conductive drive and sense electrodes may form a mutual-capacitance touch sensor having one or more capacitive nodes. The mutual-capacitance touch sensor may have either a two-layer configuration or single-layer configuration. In a single-layer configuration, drive and sense electrodes may be disposed in a pattern on one side of a substrate. In such a configuration, a pair of drive and sense electrodes capacitively coupled to each other across a space or dielectric between electrodes may form a capacitive node.

In a single-layer configuration for a self-capacitance implementation, an array of vertical and horizontal conductive electrodes may be disposed in a pattern on one side of the substrate. Each of the conductive electrodes in the array may form a capacitive node, and, when an object touches or comes within proximity of the electrode, a change in self-capacitance may occur at that capacitive node and a controller may measure the change in capacitance as a change in voltage or a change in the amount of charge needed to raise the voltage to some pre-determined amount.

A touch sensor detects the presence and location of a touch or the proximity of an object (such as a user's finger or a stylus) within a touch-sensitive area of the touch sensor overlaid, for example, on a display screen. In a touch-sensitive-display application, the touch sensor enables a user to interact directly with what is displayed on the screen, rather than indirectly with a mouse or touchpad. A touch sensor may be attached to or provided as part of a desktop computer, laptop computer, tablet computer, personal digital assistant (PDA), smartphone, satellite navigation device, portable media player, portable game console, kiosk computer, point-of-sale device, or other suitable device. A control panel on a household or other appliance may include a touch sensor.

There are different types of touch sensors, such as (for example) resistive touch screens, surface acoustic wave touch screens, capacitive touch screens, infrared touch screens, and optical touch screens. Herein, reference to a touch sensor encompasses a touch screen, and vice versa, where appropriate. A capacitive touch screen may include an insulator coated with a substantially transparent conductor in a particular pattern. When an object touches or comes within proximity of the surface of the capacitive touch screen, a change in capacitance occurs within the touch screen at the location of the touch or proximity. A controller processes the change in capacitance to determine the touch position(s) on the touch screen.

BRIEF DESCRIPTION OF THE DRAWINGS

FIGS. 4A-4H illustrate another pattern for the touch sensor of FIG. 1, according to example embodiments.

DESCRIPTION OF EXAMPLE EMBODIMENTS

Figure 1:
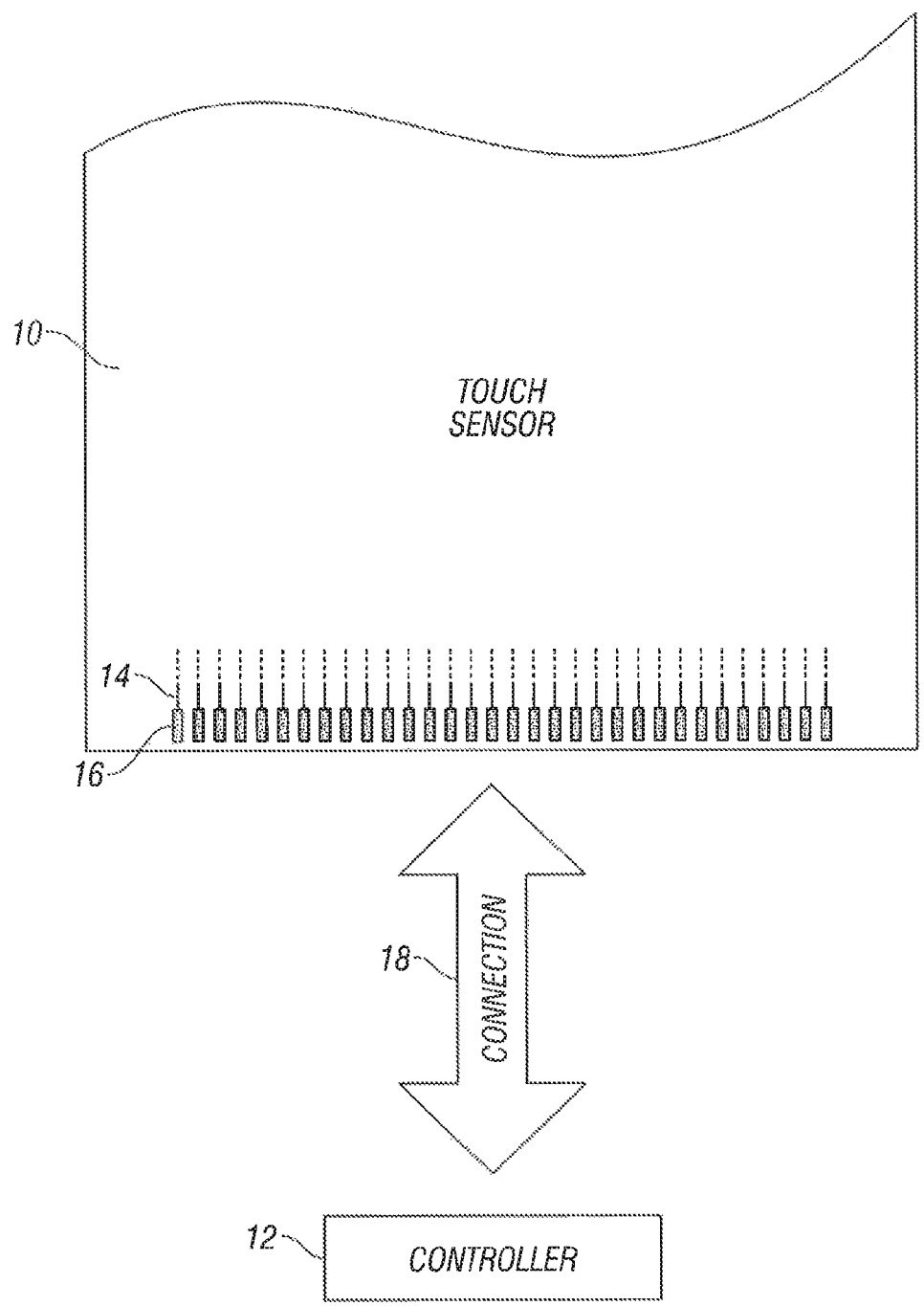
FIG. 1 illustrates a touch sensor with an example controller, according to example embodiments.

FIG. 1 illustrates an example touch sensor 10 with an example controller 12. Herein, reference to a touch sensor may encompass a touch screen, and vice versa, where appropriate. Touch sensor 10 and controller 12 detect the presence and location of a touch or the proximity of an object within a touch-sensitive area of touch sensor 10. Herein, reference to a touch sensor encompasses both the touch sensor and its controller, where appropriate. Similarly, reference to a controller encompasses both the controller and its touch sensor, where appropriate. Touch sensor 10 includes one or more touch-sensitive areas, where appropriate. Touch sensor 10 includes an array of drive and sense electrodes disposed on a substrate, which in some embodiments is a dielectric material.

In certain embodiments, one or more portions of the substrate of touch sensor 10 are made of polyethylene terephthalate (PET) or another suitable material. This disclosure contemplates any suitable substrate with any suitable portions made of any suitable material. In particular embodiments, the drive electrodes, sense electrodes, and other conductors in touch sensor 10 are made of indium tin oxide (ITO), copper or copper-based materials, silver or silver-based materials, carbon-based materials (e.g., graphene plus carbon nanotubes, buds, and wires), conductive polymers, or any other appropriate material, in whole or in part. In particular embodiments, the drive or sense electrodes in touch sensor 10 are made of fine lines of metal or other conductive material. As an example and not by way of limitation, one or more portions of the conductive material are copper or copper-based and have a thickness of approximately 5 µm or less and a width of approximately 10 µm or less. As another example, one or more portions of the conductive material are silver or silver-based and similarly have a thickness of approximately 5 µm or less and a width of approximately 10 µm or less. This disclosure contemplates any suitable electrodes made of any suitable material.

In certain embodiments, touch sensor 10 implements a capacitive form of touch sensing. In a mutual-capacitance implementation, touch sensor 10 includes an array of drive and sense electrodes forming an array of capacitive nodes. In certain embodiments, a drive electrode and a sense electrode form a capacitive node. The drive and sense electrodes forming the capacitive node come near each other, but do not make electrical contact with each other. Instead, the drive and sense electrodes are capacitively coupled to each other across a gap between them. A pulsed or alternating voltage applied to the drive electrode (i.e., by controller 12) induces a charge on the sense electrode, and the amount of charge induced is susceptible to external influence (such as a touch or the proximity of an object). When an object touches or comes within proximity of the capacitive node, a change in capacitance occurs at the capacitive node and controller 12 measures the change in capacitance. By measuring changes in capacitance throughout the array, controller 12 determines the position of the touch or proximity within the touch-sensitive area(s) of touch sensor 10.

In particular embodiments, one or more drive electrodes together form a drive line running horizontally or vertically or in any suitable orientation. Similarly, one or more sense electrodes together form a sense line running horizontally or vertically or in any suitable orientation. In particular embodiments, drive lines run substantially perpendicular to sense lines. Herein, reference to a drive line encompasses one or more drive electrodes making up the drive line, and vice versa, where appropriate. Similarly, reference to a sense line encompasses one or more sense electrodes making up the sense line, and vice versa, where appropriate.

In certain embodiments, touch sensor 10 has a single-layer configuration, with drive and sense electrodes disposed in a pattern on one side of a substrate. In such a configuration, a pair of drive and sense electrodes capacitively coupled to each other across a space between them forms a capacitive node. In a single-layer configuration for a self-capacitance implementation, electrodes of only a single type (e.g. drive) are disposed in a pattern on one side of the substrate. Although this disclosure describes particular configurations of particular electrodes forming particular nodes, this disclosure contemplates any suitable configuration of any suitable electrodes forming any suitable nodes. Moreover, this disclosure contemplates any suitable electrodes disposed on any suitable number of any suitable substrates in any suitable patterns.

As described above, a change in capacitance at a capacitive node of touch sensor 10 may indicate a touch or proximity input at the position of the capacitive node. Controller 12 is operable to detect and process the change in capacitance to determine the presence and location of the touch or proximity input. Certain embodiments if controller 12 communicate information about the touch or proximity input to one or more other components (such one or more central processing units (CPUs) or digital signal processors (DSPs)) of a device that includes touch sensor 10 and controller 12, which may respond to the touch or proximity input by initiating a function of the device (or an application running on the device) associated with it. Although this disclosure describes a particular controller having particular functionality with respect to a particular device and a particular touch sensor, this disclosure contemplates any suitable controller having any suitable functionality with respect to any suitable device and any suitable touch sensor.

In certain embodiments, controller 12 is one or more integrated circuits (ICs)—such as for example general-purpose microprocessors, microcontrollers, programmable logic devices or arrays, and application-specific ICs (ASICs). In some embodiments, controller 12 is coupled to a flexible printed circuit (FPC) bonded to the substrate of touch sensor 10, as described below. Certain embodiments of controller 12 include a processor unit, a drive unit, a sense unit, and a storage unit. The drive unit supplies drive signals to the drive electrodes of touch sensor 10. The sense unit senses charge at the capacitive nodes of touch sensor 10 and provides measurement signals to the processor unit representing capacitances at the capacitive nodes. The processor unit controls the supply of drive signals to the drive electrodes by the drive unit and process measurement signals from the sense unit to detect and process the presence and location of a touch or proximity input within the touch-sensitive area(s) of touch sensor 10. The processor unit also tracks changes in the position of a touch or proximity input within the touch-sensitive area(s) of touch sensor 10. The storage unit, which includes one or more memory devices, stores programming for execution by the processor unit, including programming for controlling the drive unit to supply drive signals to the drive electrodes, programming for processing measurement signals from the sense unit, and other suitable programming, where appropriate. Although this disclosure describes a particular controller having a particular implementation with particular components, this disclosure contemplates any suitable controller having any suitable implementation with any suitable components.

Tracks 14 of conductive material disposed on the substrate of touch sensor 10 couple the drive or sense electrodes of touch sensor 10 to connection pads 16, also disposed on the substrate of touch sensor 10. As described below, connection pads 16 facilitate coupling of tracks 14 to controller 12. In certain embodiments, tracks 14 extend into or around (e.g. at the edges of) the touch-sensitive area(s) of touch sensor 10. Particular tracks 14 provide drive connections for coupling controller 12 to drive electrodes of touch sensor 10, through which the drive unit of controller 12 supplies drive signals to the drive electrodes. Other tracks 14 provide sense connections for coupling controller 12 to sense electrodes of touch sensor 10, through which the sense unit of controller 12 senses charge at the capacitive nodes of touch sensor 10. In certain embodiments, tracks 14 are made of fine lines of metal or other conductive material. As an example and not by way of limitation, the conductive material of tracks 14 is copper or copper-based and has a width of approximately 100 µm or less. As another example, the conductive material of tracks 14 is silver or silver-based and has a width of approximately 100 µm or less. In particular embodiments, tracks 14 are made of ITO in whole or in part in addition or as an alternative to fine lines of metal or other conductive material. Although this disclosure describes particular tracks made of particular materials with particular widths, this disclosure contemplates any suitable tracks made of any suitable materials with any suitable widths. In addition to tracks 14, certain embodiments of touch sensor 10 include one or more ground lines terminating at a ground connector (similar to a connection pad 16) at an edge of the substrate of touch sensor 10 (similar to tracks 14).

In certain embodiments, connection pads 16 are located along one or more edges of the substrate, outside the touch-sensitive area(s) of touch sensor 10. As described above, controller 12 is on an FPC in certain embodiments. In some embodiments, connection pads 16 are made of the same material as tracks 14 and are bonded to the FPC using an anisotropic conductive film (ACF). In certain embodiments, connection 18 includes conductive lines on the FPC coupling controller 12 to connection pads 16, in turn coupling controller 12 to tracks 14 and to the drive or sense electrodes of touch sensor 10. In another embodiment, connection pads 160 are inserted into an electro-mechanical connector (such as a zero insertion force wire-to-board connector); in this embodiment, connection 180 does not need to include an FPC. This disclosure contemplates any suitable connection 18 between controller 12 and touch sensor 10.

Figure 2:
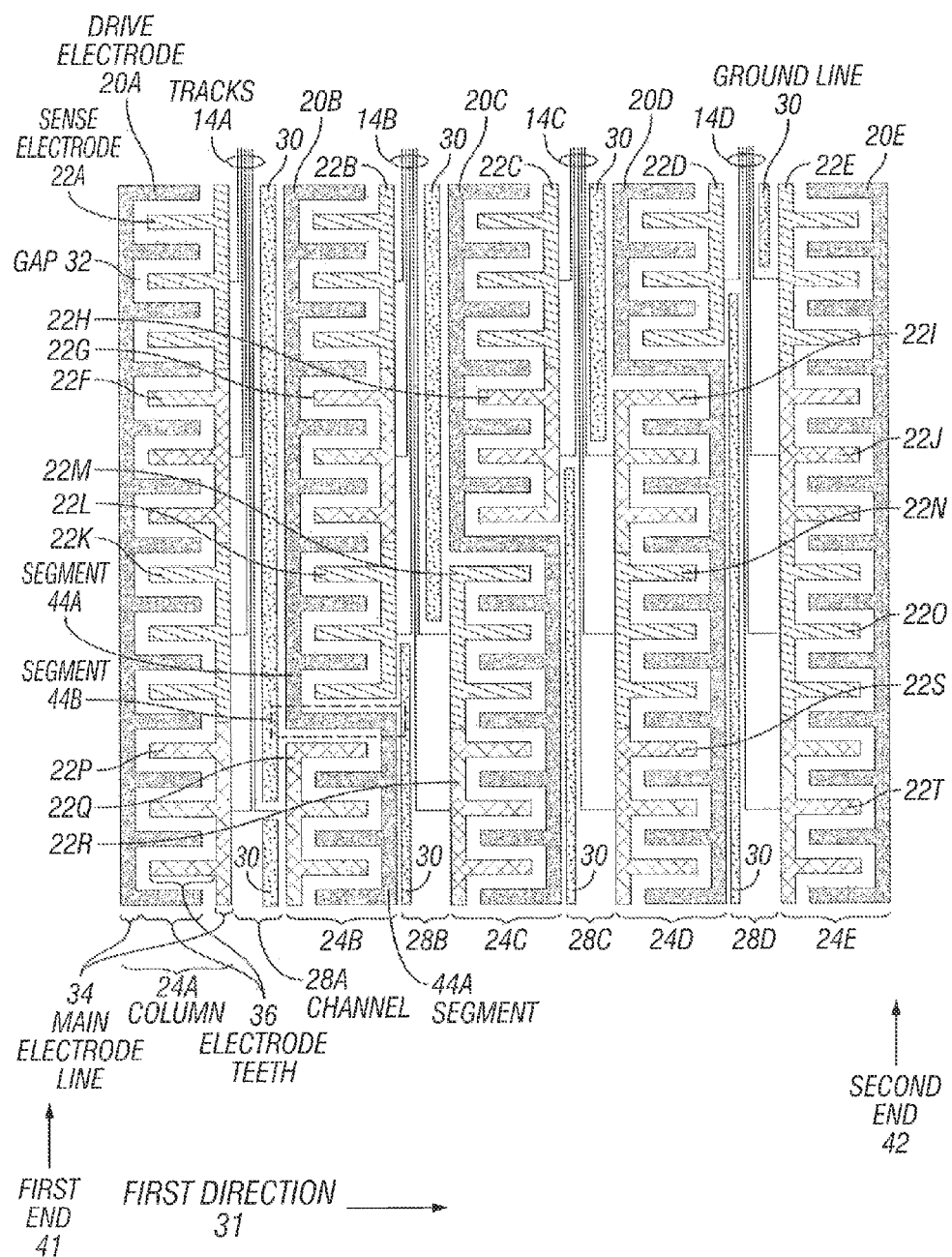
FIG. 2 illustrates a pattern for the touch sensor of FIG. 1, according to example embodiments.

FIG. 2 illustrates an example single-layer touch sensor 10 for use in the example system of FIG. 1. In the example of FIG. 2, touch sensor 10 includes an array of drive electrodes 20A-E and sense electrodes 22A-T defining a touch-sensitive area of touch sensor 10. In this embodiment, drive electrodes 20A-E and sense electrodes 22A-T are grouped into columns 24 which extend perpendicular to a first direction 31 that extends between a first end 41 and a second end 42 of a substrate. Each column includes a single drive electrode 20 and one or more sense electrodes 22. Tracks 14 couple drive electrodes 20 and sense electrodes 22 to controller 12 and are routed through channels 28A-28D. While a particular number of columns 24, drive electrodes 20, sense electrodes 22, and channels 28 are illustrated in FIG. 2, other embodiments may have any appropriate number of these elements. Furthermore, in some embodiments, electrodes 20 may be sense electrodes and electrodes 22 may be drive electrodes (i.e., the functions of drive electrodes 20 and sense electrodes 22 may be swapped).

In general, the example embodiment of FIG. 2 provides an edgeless single-layer touch sensor that offers many advantages over typical touch sensors. Typically, touch sensors route tracks such as tracks 14 along the outer edges (e.g., top, bottom, and sides) of the touch sensor. This may be undesirable because it may cause regions along the edges of the touch sensor to be less sensitive to touch. Touch sensor 10, however, utilizes columns 24 along the edges of touch sensor 10 (i.e., columns 24A and 24E) that are disposed as close to the edge of touch sensor 10 as possible. To do so, touch sensor 10 routes tracks 14 of these edge columns in channels 28 that are on opposite sides of the columns from the edge of the touch sensor. For example, tracks 14 of a first column 24A are routed in a first channel 28A that is on the opposite side of column 24A from first end 41, and tracks 14 of a second column 24E are routed in a second channel 28D that is on the opposite side of column 24E from second end 42. The tracks of interior columns 24 (e.g., columns 24B-D) are then dispersed amongst channels 28 in any appropriate manner or configuration. This allows columns 24 to be pushed out towards the edges of touch sensor 10 and therefore provides improved touch sensitivity along the edges of touch sensor 10.

Each column 24 of the array includes a single drive electrode 20 and one or more sense electrodes 22 that are disposed adjacent to the drive electrode 20 of that column. As an example and not by way of limitation, column 24A of the array includes drive electrode 20A with corresponding sense electrodes 22A, 22F, 22K, and 22P disposed adjacent to drive electrode 20A. The tracks 14 that couple each sense electrode 22 to controller 12 are routed through channels 28 that are substantially parallel to columns 24 of the array. As an example and not by way of limitation, tracks 14A that couple sense electrodes 22A, 22F, 22K, and 22P to controller 12 are routed through channel 28A. The drive electrode 20 of each column 24 is capacitively coupled to the one or more adjacent sense electrodes 22 of that column, and a gap 32 separates drive electrode 20 and sense electrodes 22.

An electrode (whether a drive electrode 20 or a sense electrode 22) is an area of conductive material forming a shape, such as for example a disc, square, rectangle, other suitable shape, or suitable combination of these. In particular embodiments, the conductive material of an electrode, e.g., 22A and 20C, occupies approximately 100% of the area of its shape. As an example and not by way of limitation, drive and sense electrodes e.g., 22A and 20C, along with electrode connectors, are made of indium tin oxide (ITO) and the ITO of the drive and sense electrodes, e.g., 22A and 20C, occupies approximately 100% of the area of its shape, where appropriate. In particular embodiments, the conductive material of an electrode, e.g., 22A and 20C, occupies approximately 50% of the area of its shape. As an example and not by way of limitation, an electrode, e.g., 22A and 20C, is made of ITO and the ITO of the drive and sense electrodes, e.g., 22A and 20C, occupies approximately 50% of the area of its shape in a hatched or other suitable pattern.

In particular embodiments, the conductive material of an electrode, e.g., 22A and 20C, occupies approximately 5% of the area of its shape. As an example and not by way of limitation, an electrode, e.g., 22A and 20C, is made of fine lines of metal (such as for example copper, silver, or a copper- or silver-based material) or other conductive material and the fine lines of conductive material occupy approximately 5% of the area of its shape in a hatched or other suitable pattern. Although this disclosure describes or illustrates particular electrodes made of particular conductive material forming particular shapes with particular fills having particular patterns, this disclosure contemplates any suitable electrodes made of any suitable conductive material forming any suitable shapes with any suitable fills having any suitable patterns. Where appropriate, the shapes of the electrodes (or other elements) of a touch sensor constitute in whole or in part one or more macro-features of certain embodiments of the touch sensor. One or more characteristics of the implementation of those shapes (such as, for example, the conductive materials, fills, or patterns within the shapes or the means of electrically isolating or physically separating the shapes from each other) constitute in whole or in part one or more micro-features of certain embodiments of the touch sensor.

In particular embodiments, drive electrodes 20 and sense electrodes 22 include individual electrode teeth 36 that protrude from main electrode lines 34 and thereby form a caterpillar design. In certain embodiments, electrode teeth 36 of each sense electrode 22 in a particular column 24 are adjacent to one or more electrode teeth 36 of a corresponding drive electrode 20 of that column and thereby form capacitive coupling edges that are separated by gap 32. Electrode teeth 36 may be interleaved or interdigitated to increase the number of capacitive coupling edges between one or more sense electrodes 22 and a corresponding drive electrode 20. As an example and not by way of limitation, electrode teeth 36 of sense electrodes 22A, 22F, 22K, and 22P are interdigitated with electrode teeth 36 of corresponding drive electrode 20A. Capacitive coupling between sense electrodes and a corresponding drive electrode is determined by dimensions of gap 32 and edges of electrode teeth 36.

In some embodiments, gap 32 is substantially uniform (e.g., gap 32 between drive electrodes 20 and sense electrodes 22 and their corresponding electrode teeth 36 is substantially the same width). In other embodiments, gap 32 may not be uniform. In addition, certain embodiments include drive electrodes 20, sense electrodes 22, and electrode teeth 36 that have substantially similar widths (e.g., the widths of electrode teeth 36 and main electrode lines 34 of drive electrodes 20 and sense electrodes 22 are substantially the same). In other embodiments, drive electrodes 20, sense electrodes 22, and electrode teeth 36 do not have substantially similar widths (e.g., the widths of electrode teeth 36 and main electrode lines 34 of drive electrodes 20 and sense electrodes 22 are not substantially the same). In some embodiments, gap 32 is substantially filled with in-fill shapes 46 (illustrated in FIGS. 4A-4H) that are floating (e.g., not electrically coupled to anything such as drive electrodes 20 or sense electrodes 22). In such embodiments, a smaller gap will separate the fill-in shapes 46 and the electrodes. In certain embodiments, the material in gap 32 is the same material as drive electrodes 20 and sense electrodes 22. Although this disclosure describes and illustrates a particular arrangement of electrodes for touch sensor 10, this disclosure contemplates any suitable arrangement of electrodes for touch sensor 10.

In the illustrated embodiment of FIG. 2, the width of the discrete pieces of material forming the various portions of drive electrodes 20, sense electrodes 22, electrode teeth 36, main electrode lines 34, etc., and the spacing between those pieces and other portions of touch sensor 10, is not uniform. In certain embodiments, the width of those pieces and the spacing between them and other portions of touch sensor 10 is substantially uniform. In embodiments where the width of those pieces and the spacing between them is substantially uniform, visual artifacts are reduced and images viewed through the sensor are affected less than with non-uniform sensors. In such uniform sensor embodiments, the uniformity can be achieved by appropriate design of the various portions of the electrodes of touch sensor 10 and/or by adjusting the spacing between them. As just one example, disconnected pieces of the same material used to form the electrodes of touch sensor 10 may be positioned in any open spaces of touch sensor 10. For example, disconnected material may be placed in any open space between columns 24 such as between column 24A and 24B, and the like. Likewise, open spaces illustrated in FIGS. 3 and 4A-4H may also be filled with such disconnected material. Such disconnected pieces of material used to fill the open spaces of touch sensor 10 are not electrically connected to any tracks 14 and do not function as electrodes.

In certain embodiments, main electrode lines 34 include one or more electrode teeth 36 that are coupled to and protrude perpendicularly from main electrode line 34. Electrode teeth 36 of a drive electrode 20 are generally interdigitated with electrode teeth 36 of one or more sense electrodes 22. For example, electrode teeth 36 of drive electrode 20A are interdigitated with electrode teeth 36 of sense electrodes 22A, 22F, 22K, and 22P (i.e., electrode teeth 36 of drive electrode 20A are alternating with electrode teeth 36 of sense electrodes 22A, 22F, 22K, and 22P along a direction that is perpendicular to first direction 31).

Optical properties of gap 32 as well as voids within other areas of the array with large dimensions relative to feature sizes of drive electrodes 20 may have different optical properties than the optical properties of the electrodes (either sense electrodes 22 or drive electrodes 20). Optical discontinuities may occur when viewing a display underneath touch sensor 10 due to these differences in optical properties. In certain embodiments, gaps 32 and other voids within other areas of the array are substantially filled using the conductive material used to fabricate drive electrodes 20 and sense electrodes 22 in such a way to electrically isolate the filled in areas from nearby drive electrodes 20 and sense electrodes 22 or tracks 14. In particular embodiments, gaps 32 and other voids are substantially filled using "in-fill" shapes 46 of electrode conductive material isolated from neighboring in-fill shapes by non-conducting gaps. The isolated in-fill shapes 46 may serve to visually obscure a pattern of drive electrodes 20 and sense electrodes 22, while having a minimal impact on the fringing fields between adjacent electrodes. Therefore, using in-fill shapes 46 may have electric field distributions substantially similar to electric field distributions without in-fill shapes. In certain embodiments, the in-filling is formed during manufacture and using the same process steps as drive electrodes 20 and sense electrodes 22, such that in-fill shapes 46 are formed from the same material and have substantially the same thickness and electrical properties as drive electrodes 20 and sense electrodes 22.

Filling in gap 32 and other voids using in-fill shapes 46 reduces a number of areas with optical discontinuities visible when viewing the display. In particular embodiments, in-fill shapes are formed using metal, conductive plastic, ITO, or other form of conductive material, such as fine line metal. In certain embodiments, the material used to fill in a gap 32 and other voids depends on the conductive material used to fabricate drive electrodes 20 and sense electrodes 22. As an example and not by way of limitation, certain embodiments of gaps 32 and other voids are substantially filled in using a series of electrically isolated squares formed during fabrication of drive electrodes 20 and sense electrodes 22. Although this disclosure describes or illustrates particular in-fill shapes 46 having particular patterns, this disclosure contemplates any suitable in-fill shapes having any suitable patterns.

Drive electrodes 20 and sense electrodes 22 are coupled to tracks, e.g., tracks 14A-D, which communicatively couple the electrodes to controller 12. As described above, controller 12 transmits drive signals to drive electrodes 20 and receives sensing signals from sense electrodes 22 through tracks 14A-D to determine the position of an object adjacent touch sensor 10 (e.g., a finger or a stylus). Tracks 14 are routed through channels 28, which are adjacent to one or more columns 24. The tracks coupled to the electrodes of the outer columns (i.e., columns 24A and 24E) are routed through channels 28 that are located on opposite sides of the columns from the edge of touch sensor 10 (e.g., channels 28A and 28D). Tracks 14 coupled to interior columns (e.g., columns 24B-D) are dispersed amongst channels 28 as discussed in more detail below.

As discussed above, touch sensor 10 includes two columns 24 (i.e., first column 24A and second column 24E) that are placed close to or at the edges of touch sensor 20 (e.g., first end 41 and second end 42, respectively) in order to improve touch sensitivity near the edges of the touch sensor. In some embodiments, first column 24A includes drive electrode 20A that is formed from a main electrode line 34 and electrode teeth 36. The main electrode line 34 of drive electrode 20A is adjacent to first end 41 and is perpendicular to first direction 31. Electrode teeth 36 of drive electrode 20A are coupled to main electrode line 34 of drive electrode 20A on a side of main electrode line 34 of drive electrode 20A that is opposite from first end 41 of the substrate (e.g., on the right side of main electrode line 34 of drive electrode 20A). Drive electrode 20A (and other similarly oriented electrodes such as sense electrode 22E, 22J, 22O, and 22T) may be hereinafter referred to as "pointing right" or "right-pointing electrodes." Similarly, second column 24E includes drive electrode 20E that is formed from a main electrode line 34 and electrode teeth 36. The main electrode line 34 of drive electrode 20E is adjacent to second end 42 of the substrate and is perpendicular to first direction 31. Electrode teeth 36 of drive electrode 20E are coupled to main electrode line 34 of drive electrode 20E on a side of main electrode line 34 of drive electrode 20E that is opposite from second end 41 of the substrate (e.g., on the left side of main electrode line 34 of drive electrode 20E). Drive electrode 20E (and other similarly oriented electrodes such as sense electrode 22A. 22F, 22K, and 22P) may be hereinafter referred to as "pointing left" or "left-pointing electrodes."

As discussed above, some embodiments include one or more interior columns 24 (e.g., columns 24B-D). Tracks 14 that couple interior columns 24 to controller 12 are dispersed amongst channels 28. For example, tracks 14 that couple interior columns 24A-D of touch sensor 10 in FIG. 2 are dispersed amongst channels 28A-D. In particular, column 24B includes four sense electrodes: 22B, 22G, 22L, and 22Q. Track 14 coupled to sense electrode 22Q (the bottom-most sense electrode 22) is routed through channel 28A, and tracks 14 coupled to sense electrodes 22B, 22G, and 22L are routed through channel 28B. Column 24C includes four sense electrodes: 22C, 22H, 22M, and 22R. Tracks 14 coupled to sense electrodes 22M and 22R (the two bottom-most sense electrodes 22) are routed through channel 28B, and tracks 14 coupled to sense electrodes 22C and 22H are routed through channel 28C. Column 24D includes four sense electrodes: 22D, 22I, 22N, and 22S. Tracks 14 coupled to sense electrodes 22I, 22N, and 22S (the three bottom-most sense electrodes 22) are routed through channel 28C, and track 14 coupled to sense electrode 22D is routed through channel 28D.

In order to accommodate the routing of tracks 14 through the various channels 28 as described above, certain embodiments have different arrangements of electrodes within interior columns 24. For example, each interior column 24 of the example touch sensor 10 of FIG. 2 includes a drive electrode 20 that has a main electrode line 34 that is not one straight segment as is the case with the outer columns 24 (e.g., columns 24A and 24E). Instead, main electrode lines 34 of the interior columns 24 include at least three segments. For example, each main electrode line 34 of drive electrodes 20B-D include two segments that are perpendicular to first direction 31 (e.g., segments 44A), and one segment that is parallel to first direction 31 (e.g., segment 44B). In addition, each interior column 24 in certain embodiments includes both left-pointing and right-pointing sense electrodes 22. For example, column 24B includes three left-pointing sense electrodes 22 above segment 44B (e.g., sense electrodes 22B, 22G, and 22K), and one right-pointing sense electrode 22 below segment 44B (e.g., sense electrode 22Q). Column 24C includes two left-pointing sense electrodes 22 above segment 44B (e.g., sense electrodes 22C and 22H), and two right-pointing sense electrode 22 below segment 44B (e.g., sense electrodes 22M and 22R). Column 24D includes one left-pointing sense electrode 22 above segment 44B (e.g., sense electrode 22D), and three right-pointing sense electrodes 22 below segment 44B (e.g., sense electrodes 22I, 22N, and 22S). While certain arrangements of electrodes 20 and 22 for interior columns 24 are illustrated in FIG. 2, other embodiments may have other arrangements of these electrodes. For example, main electrode line 34 may include more than two segments that are perpendicular to first direction 31 and more than one segment that is parallel to first direction 31 in certain embodiments. As another example, certain embodiments may include more than three interior columns (as illustrated in FIGS. 4A-4H), and the number of sense electrodes 22 above and below segment 44B may be varied as desired. The disclosure is not limited to the illustrated configuration of electrodes illustrated in FIG. 2.

In certain embodiments, touch sensor 10 may include ground lines 30. For example, the touch sensor 10 of FIG. 2 includes ground lines 30 located within channels 28 as illustrated. In other embodiments, ground lines 30 may be included around the perimeter of columns 24 as illustrated in FIGS. 4A-4H. In some embodiments, ground lines may be tapered (i.e., smaller on one end than the opposite end) as illustrated in FIGS. 4A-4H. While certain ground lines 30 are illustrated in FIGS. 2-4H, this disclosure anticipates any appropriate use and pattern of ground lines 30.

Figure 3:
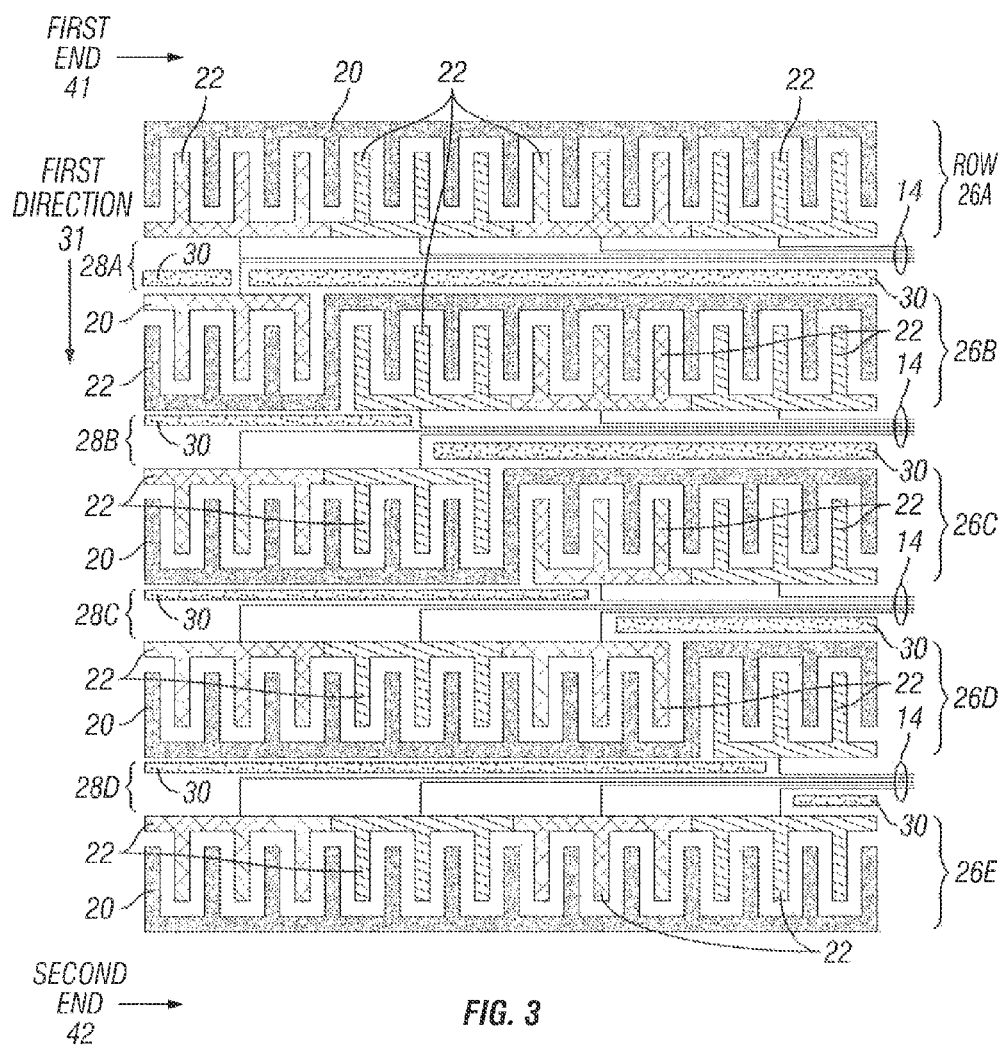
FIG. 3 illustrates another orientation for the touch sensor pattern of FIG. 2, according to example embodiments.

FIG. 3 illustrates another example single-layer touch sensor for use in the example system of FIG. 1. Similar to the example of FIG. 2, the embodiment of touch sensor 10 in FIG. 3 includes an array of drive electrodes 20A-E and sense electrodes 22A-T defining a touch-sensitive area of touch sensor 10. In this embodiment, however, drive electrodes 20A-E and sense electrodes 22A-T are grouped into rows 26 which extend perpendicular to first direction 31 that extends between first end 41 and second end 42 of a substrate as illustrated. Each row 26 includes a single drive electrode 20 and one or more sense electrodes 22. Tracks 14 couple drive electrodes 20 and sense electrodes 22 to controller 12 and are routed through channels 28A-28D which run parallel to rows 26.

In general, the example embodiment of FIG. 3 also provides an edgeless single-layer touch sensor that offers many advantages over typical touch sensors. Touch sensor 10 utilizes rows 26 along the edges of touch sensor 10 (i.e., rows 26A and 26E) that are disposed as close to the top and bottom edges of touch sensor 10 as possible. To do so, touch sensor 10 routes tracks 14 of these edge rows in channels 28 that are on opposite sides of the rows from the edge of the touch sensor. For example, tracks 14 of a first row 26A are routed in a first channel 28A that is on the opposite side of row 26A from first end 41, and tracks 14 of a second row 26E are routed in a second channel 28D that is on the opposite side of row 26E from second end 42. The tracks of interior rows 26 (e.g., rows 26B-D) are then dispersed amongst channels 28. This allows rows 26 to be pushed out towards the edges of touch sensor 10 and therefore provides improved touch sensitivity along the edges of touch sensor 10.

FIGS. 4A-4H illustrate another example single-layer touch sensor for use in the example system of FIG. 1. Similar to the example of FIG. 2, the embodiment of touch sensor 10 in FIGS. 4A-4H includes an array of drive electrodes 20 and sense electrodes 22 defining a touch-sensitive area of touch sensor 10. Like the embodiment of FIG. 2, drive electrodes 20 and sense electrodes 22 are grouped into columns 24 which extend perpendicular to first direction 31 that extends between first end 41 and second end 42 of a substrate as illustrated. Each column 24 includes a single drive electrode 20 and one or more sense electrodes 22. Tracks 14 communicatively couple drive electrodes 20 and sense electrodes 22 to controller 12 and are routed through channels 28A-28D which run parallel to columns 24. In this embodiment however, a total of seven columns 24 and six channels 28 are provided. In addition, each column 24 includes nine sense electrodes 22. Other differences include the addition of a ground line 30 surrounding columns 24, tapered ground lines 30 within channels 28, and a floating in-fill material between drive electrodes 20 and sense electrodes 22, as illustrated.

Similar to the example embodiment of FIG. 2, the touch sensor of FIGS. 4A-4H includes interior columns 24 that have an increasing amount of right-facing sense electrodes 22 along first direction 31. More specifically, column 24B includes seven left-facing sense electrodes 22 on top of two right-facing sense electrodes 22, column 24C includes six left-facing sense electrodes 22 on top of three right-facing sense electrodes 22, column 24D includes four left-facing sense electrodes 22 on top of five right-facing sense electrodes 22, column 24E includes three left-facing sense electrodes 22 on top of six right-facing sense electrodes 22, and column 24F includes two left-facing sense electrodes 22 on top of seven right-facing sense electrodes 22. This configuration of sense electrodes 22 and drive electrodes 20 permits tracks 14 coupled to the electrodes of interior columns 24 to be dispersed amongst channels 28, as previously described.

Figure 4A:
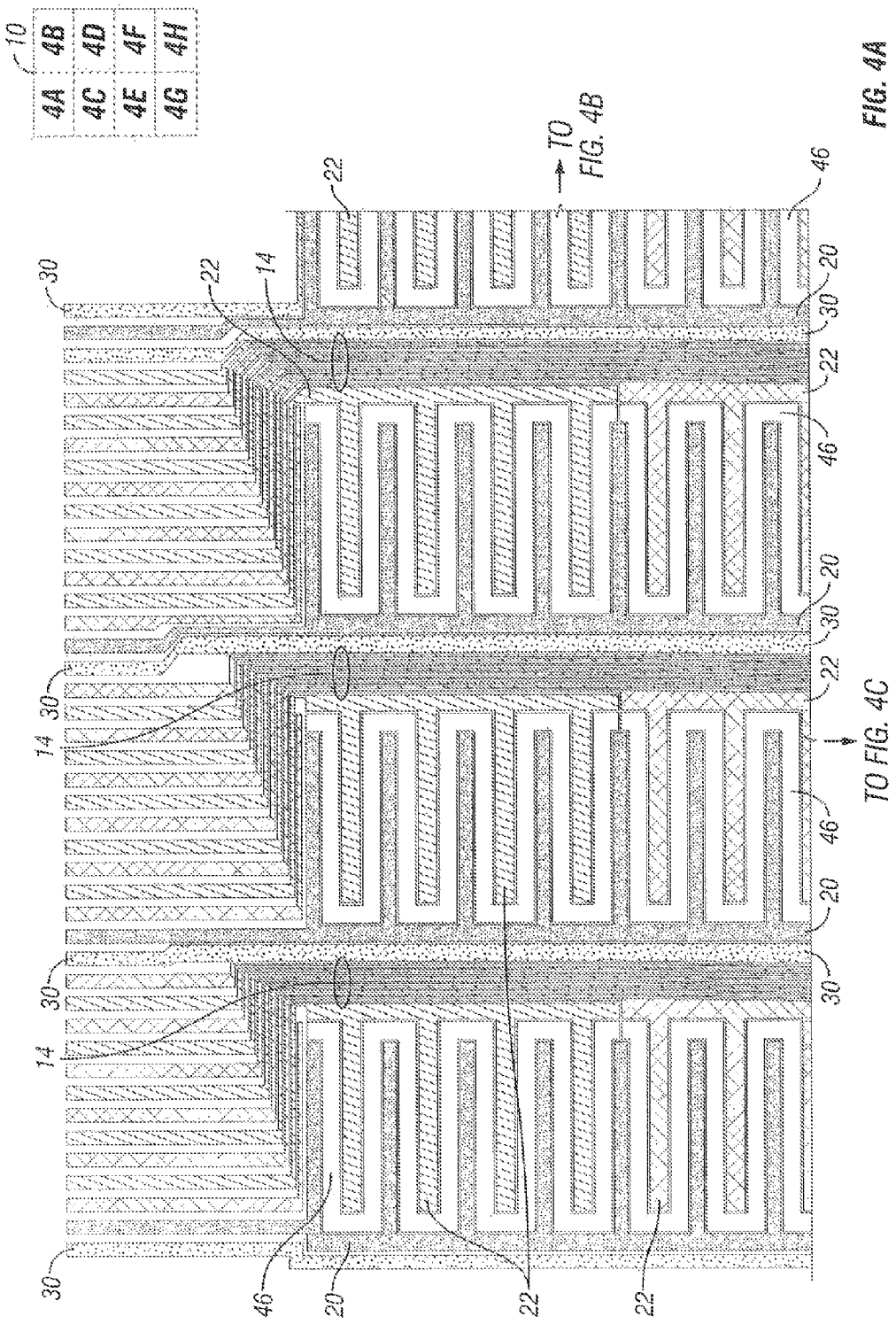
Figure 4G:
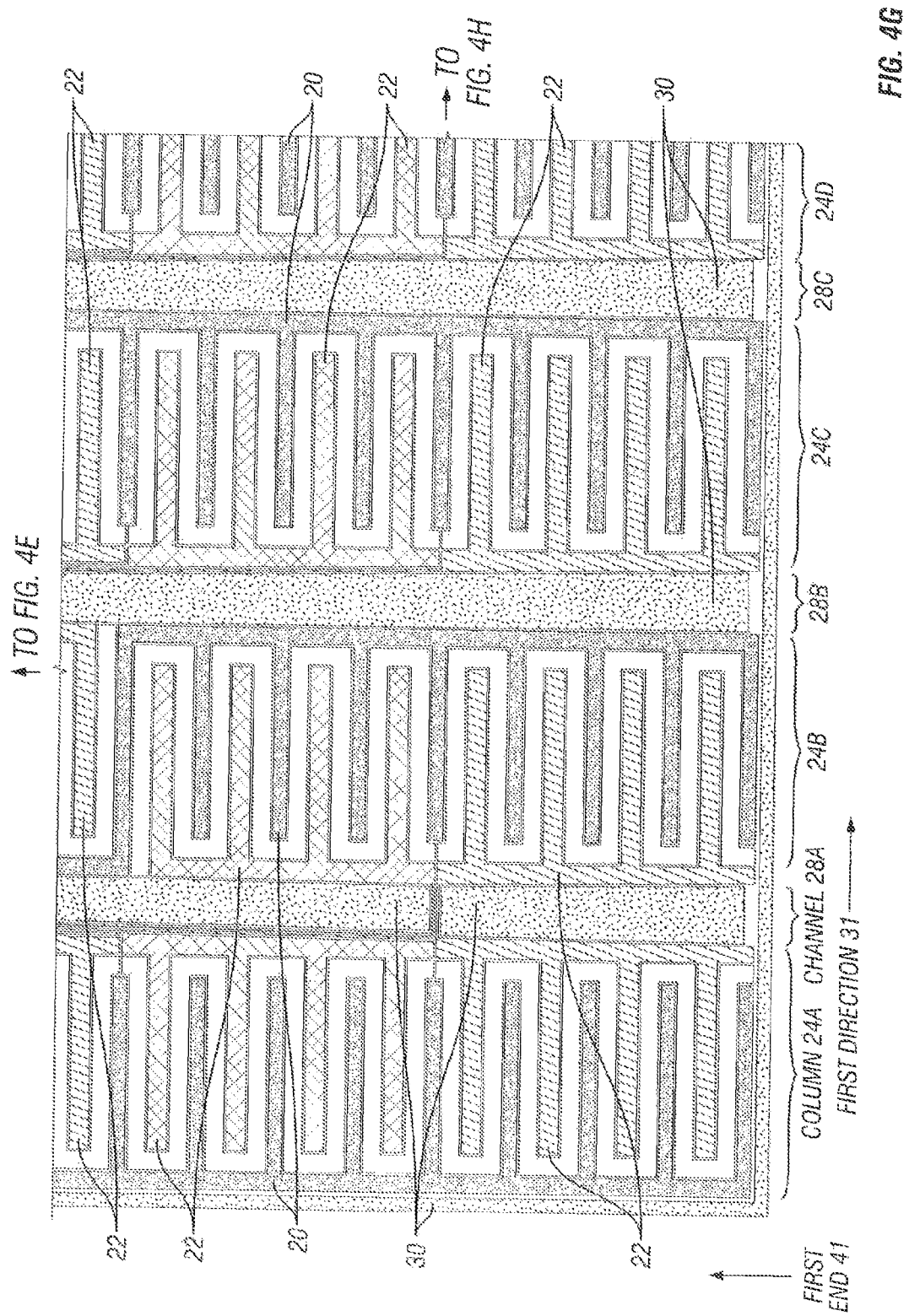

In some embodiments, sense electrodes 22 may share a single track 14. For example, the two bottom-most sense electrodes 22 of columns 24A and 24B in FIG. 4G are coupled to a single track 14 as illustrated. In other embodiments, sense electrodes 22 are each coupled to a separate track 14 (e.g., sense electrodes 22P and 22Q are coupled to separate tracks 14 as illustrated in FIG. 2).

As described in detail above, electrodes 20 are drive electrodes and electrodes 22 are sense electrodes in some embodiments. In other embodiments, electrodes 20 are sense electrodes and electrodes 22 are drive electrodes in some embodiments. The disclosure anticipates electrodes 20 and 22 being any suitable combination of drive and sense electrodes. In addition, while a certain number of electrode teeth 36 are illustrated in the figures, the disclosure anticipates any suitable number and density of electrode teeth 36. Furthermore, while particular caterpillar patterns of drive electrodes 20 and sense electrodes 22 have been illustrated, these electrodes may be formed of any appropriate pattern or shape.

Herein, reference to a computer-readable storage medium encompasses one or more non-transitory, tangible computer-readable storage media possessing structure. As an example and not by way of limitation, a computer-readable storage medium may include a semiconductor-based or other integrated circuit (IC) (such, as for example, a field-programmable gate array (FPGA) or an application-specific IC (ASIC)), a hard disk, an HDD, a hybrid hard drive (HHD), an optical disc, an optical disc drive (ODD), a magneto-optical disc, a magneto-optical drive, a floppy disk, a floppy disk drive (FDD), magnetic tape, a holographic storage medium, a solid-state drive (SSD), a RAM-drive, a SECURE DIGITAL card, a SECURE DIGITAL drive, or another suitable computer-readable storage medium or a combination of two or more of these, where appropriate. A computer-readable non-transitory storage medium may be volatile, non-volatile, or a combination of volatile and non-volatile, where appropriate.

Herein, "or" is inclusive and not exclusive, unless expressly indicated otherwise or indicated otherwise by context. Therefore, herein, "A or B" means "A, B, or both," unless expressly indicated otherwise or indicated otherwise by context. Moreover, "and" is both joint and several, unless expressly indicated otherwise or indicated otherwise by context. Therefore, herein, "A and B" means "A and B, jointly or severally," unless expressly indicated otherwise or indicated otherwise by context.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, component, whether or not it or that particular function is activated, turned on, or unlocked, as long as that apparatus, system, or component is so adapted, arranged, capable, configured, enabled, operable, or operative.

What is claimed is:

1. A touch sensor comprising:
   a substrate comprising a first end portion and a second end portion opposite the first end portion;
   a plurality of columns of electrodes disposed on a side of the substrate, each column comprising a drive electrode and a plurality of sense electrodes, the plurality of columns comprising:
      a first column adjacent to the first end portion,
      a second column adjacent to the second end portion, and
      one or more interior columns between the first and second columns; and
   a plurality of tracks coupled to the plurality of sense electrodes, respectively, of the plurality of columns;
   wherein:
      tracks coupled to the sense electrodes, respectively, of the first column are routed in a first channel that is on a side of the first column that is opposite from a side of the first column adjacent to the first end portion of the substrate;
      tracks coupled to the sense electrodes, respectively, of the second column are routed in a second channel that is on a side of the second column that is opposite from a side of the second column adjacent to the second end portion of the substrate;
      tracks coupled to the sense electrodes, respectively, of a particular one of the interior columns are routed in third channels on both sides of the particular interior column, wherein one of the third channels is the first channel; and
      the drive electrode of the particular interior column comprises a main electrode line that extends a length of the particular interior column such that a first sense electrode and a second sense electrode of the sense electrodes of the particular interior column are located on opposite sides of the main electrode line of the drive electrode.

2. The touch sensor of claim 1, wherein the drive electrodes and the sense electrodes each comprise:
   a main electrode line; and
   a plurality of electrode teeth coupled to the main electrode line;
   wherein for each of the plurality of columns, the plurality of electrode teeth of the drive electrodes are interdigitated with the plurality of electrode teeth of the sense electrodes.

3. The touch sensor of claim 2, wherein:
   the main electrode line of the drive electrode of the first column is adjacent to the first end portion;
   the plurality of electrode teeth of the drive electrode of the first column are coupled to the main electrode line of the drive electrode of the first column on a side of the main electrode line of the drive electrode of the first column that is opposite from the first end portion of the substrate;
   the main electrode line of the drive electrode of the second column is adjacent to the second end portion; and
   the plurality of electrode teeth of the drive electrode of the second column are coupled to the main electrode line of the drive electrode of the second column on a side of the main electrode line of the drive electrode of the second column that is opposite from the second end portion of the substrate.

4. The touch sensor of claim 2, wherein the main electrode line of the drive electrode of the particular interior column comprises:
   a first segment extending in a first direction,
   a second segment extending in a second direction that is different from the first direction, and
   a third segment extending in the first direction, the second segment being coupled to an end of the first segment and the third segment being coupled to an end of the second segment in order to form a continuous electrode line.

5. The touch sensor of claim 4, wherein:
   the first segment and the third segment of the main electrode line are coupled to opposite ends of the second segment of the main electrode line;

at least one of the plurality of teeth coupled to the first segment of the main electrode line of the drive electrode of the particular interior column is on a side of the main electrode line that is opposite from the first end portion of the substrate; and at least one of the plurality of teeth coupled to the third segment of the main electrode line of the drive electrode of the particular interior column is on a side of the electrode line that is opposite from the second end portion of the substrate.

6. The touch sensor of claim 2,
wherein:
the plurality of electrode teeth of the first sense electrode are coupled to the main electrode line of the first sense electrode on a side of the main electrode line of the first sense electrode that is opposite from the first end portion of the substrate; and
the plurality of electrode teeth of the second sense electrode are coupled to the main electrode line of the second sense electrode on a side of the main electrode line of the second sense electrode that is opposite from the second end portion of the substrate.

7. The touch sensor of claim 2, wherein the main electrode lines and the plurality of electrode teeth have substantially similar widths.

8. The touch sensor of claim 2, further comprising a substantially uniform gap between the plurality of electrode teeth.

9. The touch sensor of claim 8, wherein the gap is substantially filled with a conductive material that is electrically isolated from the main electrode lines and the plurality of electrode teeth.

10. A device comprising:
a touch sensor comprising:
a substrate comprising a first end portion and a second end portion opposite the first end portion;
a plurality of columns of electrodes disposed on a side of the substrate, each column comprising a drive electrode and a plurality of sense electrodes, the plurality of columns comprising:
a first column adjacent to the first end portion
a second column adjacent to the second end portion, and
one or more interior columns between the first and second columns; and
a plurality of tracks coupled to the plurality of sense electrodes, respectively, of the plurality of columns;
wherein:
tracks coupled to the sense electrodes, respectively, of the first column are routed in a first channel that is on a side of the first column that is opposite from a side of the first column adjacent to the first end portion of the substrate;
tracks coupled to the sense electrodes, respectively, of the second column are routed in a second channel that is on a side of the second column that is opposite from a side of the second column adjacent to the second end portion of the substrate;
tracks coupled to the sense electrodes, respectively, of a particular one of the interior columns are routed in third channels on both sides of the particular interior column, wherein one of the third channels is the first channel; and
the drive electrode of the particular interior column comprises a main electrode line that extends a length of the particular interior column such that a first sense electrode and a second sense electrode of the sense electrodes of the particular interior column are located on opposite sides of the main electrode line of the drive electrode; and one or more computer-readable non-transitory storage media embodying logic that is configured when executed to control the touch sensor.

11. The device of claim 10, wherein the drive electrodes and the sense electrodes each comprise:
a main electrode line; and
a plurality of electrode teeth coupled to the main electrode line;
wherein for each of the plurality of columns, the plurality of electrode teeth of the drive electrodes are interdigitated with the plurality of electrode teeth of the sense electrodes.

12. The device of claim 11, wherein:
the main electrode line of the drive electrode of the first column is adjacent to the first end portion;
the plurality of electrode teeth of the drive electrode of the first column are coupled to the main electrode line of the drive electrode of the first column on a side of the main electrode line of the drive electrode of the first column that is opposite from the first end portion of the substrate;
the main electrode line of the drive electrode of the second column is adjacent to the second end portion; and
the plurality of electrode teeth of the drive electrode of the second column are coupled to the main electrode line of the drive electrode of the second column on a side of the main electrode line of the drive electrode of the second column that is opposite from the second end portion of the substrate.

13. The device of claim 11, wherein the main electrode line of the drive electrode of the particular interior column comprises:
a first segment extending in a first direction,
a second segment extending in a second direction that is different from the first direction, and
a third segment extending in the first direction, the second segment being coupled to an end of the first segment and the third segment being coupled to an end of the second segment in order to form a continuous electrode line.

14. The device of claim 11,
wherein:
the plurality of electrode teeth of the first sense electrode are coupled to the main electrode line of the first sense electrode on a side of the main electrode line of the first sense electrode that is opposite from the first end portion of the substrate; and
the plurality of electrode teeth of the second sense electrode are coupled to the main electrode line of the second sense electrode on a side of the main electrode line of the second sense electrode that is opposite from the second end portion of the substrate.

15. The device of claim 11, wherein the main electrode lines and the plurality of electrode teeth have substantially similar widths.

16. A touch sensor comprising:
a substrate comprising a first end portion and a second end portion opposite the first end portion;
a plurality of rows of electrodes disposed on a side of the substrate, each row comprising a drive electrode and a plurality of sense electrodes, the plurality of rows comprising:

a first row adjacent to the first end portion,
a second row adjacent to the second end portion, and
one or more interior rows between the first and second rows; and
a plurality of tracks coupled to the plurality of sense electrodes, respectively, of the plurality of rows;
wherein:
tracks coupled to the sense electrodes, respectively, of the first row are routed in a first channel that is on a side of the first row that is opposite from a side of the first row adjacent to the first end portion of the substrate;
tracks coupled to the sense electrodes, respectively, of the second row are routed in a second channel that is on a side of the second row that is opposite from a side of the second row adjacent to the second end portion of the substrate;
tracks coupled to the sense electrodes, respectively, of a particular one of the interior rows are routed in third channels on both sides of the particular interior row, wherein one of the third channels is the first channel; and
the drive electrode of the particular interior row comprises a main electrode line that extends a length of the particular interior row such that a first sense electrode and a second sense electrode of the sense electrodes of the particular interior row are located on opposite sides of the main electrode line of the drive electrode.

17. The touch sensor of claim 16, wherein the drive electrodes and the sense electrodes each comprise:
a main electrode line; and
a plurality of electrode teeth coupled to the main electrode line;
wherein for each of the plurality of rows, the plurality of electrode teeth of the drive electrodes are interdigitated with the plurality of electrode teeth of the sense electrodes.

18. The touch sensor of claim 17, wherein:
the main electrode line of the drive electrode of the first row is adjacent to the first end portion;
the plurality of electrode teeth of the drive electrode of the first row are coupled to the main electrode line of the drive electrode of the first row on a side of the main electrode line of the drive electrode of the first row that is opposite from the first end portion of the substrate;
the main electrode line of the drive electrode of the second row is adjacent to the second end portion; and
the plurality of electrode teeth of the drive electrode of the second row are coupled to the main electrode line of the drive electrode of the second row on a side of the main electrode line of the drive electrode of the second row that is opposite from the second end portion of the substrate.

19. The touch sensor of claim 17, wherein the main electrode line of the drive electrode of the particular interior row comprises:
a first segment extending in a first direction,
a second segment extending in a second direction that is different from the first direction, and
a third segment extending in the first direction, the second segment being coupled to an end of the first segment and the third segment being coupled to an end of the second segment in order to form a continuous electrode line.

20. The touch sensor of claim 17,
wherein:
the plurality of electrode teeth of the first sense electrode are coupled to the main electrode line of the first sense electrode on a side of the main electrode line of the first sense electrode that is opposite from the first end portion of the substrate; and
the plurality of electrode teeth of the second sense electrode are coupled to the main electrode line of the second sense electrode on a side of the main electrode line of the second sense electrode that is opposite from the second end portion of the substrate.

21. The touch sensor of claim 17, wherein the main electrode lines and the plurality of electrode teeth have substantially similar widths.

* * * * *